United States Patent [19]

Reynolds, III et al.

[11] 4,445,952
[45] May 1, 1984

[54] APPARATUS AND METHOD FOR FILLING HOLES IN A CIRCUIT BOARD

[75] Inventors: Frederick W. Reynolds, III, Mission Viejo; Robert E. Miranda, Brea; Roger C. Fabian, Van Nuys, all of Calif.

[73] Assignee: TRW Inc., Redondo Beach, Calif.

[21] Appl. No.: 317,849

[22] Filed: Nov. 3, 1981

[51] Int. Cl.³ ............................................. B32B 35/00
[52] U.S. Cl. .................... 156/94; 29/402.18; 29/829; 156/150; 156/155; 156/247; 156/289; 156/293; 156/305; 156/323; 156/344; 156/429; 156/583.1; 174/68.5; 204/22; 427/272; 427/140
[58] Field of Search ............... 29/829, 402.09, 402.18; 156/94, 150, 155, 247, 289, 293, 305, 323, 344, 156/423, 583.1; 174/68.5; 204/22; 427/272, 140

[56] References Cited

PUBLICATIONS

Gardner et al., "Sealing of Apertures in Printed Circuit Packages", IBM Technical Disclosure Bulletin, vol. 14, No. 8, Jan. 1972 (p. 2459).
McDermott, "Face Protection of Printed Circuit Boards", IBM Technical Disclosure Bulletin, vol. 11, No. 7, Dec. 1968, p. 733.
Mendola, "Filling Holes in Printed Circuit Boards", IBM Technical Disclosure Bulletin, vol. 12, No. 4, Sep. 1969, p. 512.

Primary Examiner—Robert A. Dawson
Attorney, Agent, or Firm—Stuart O. Lowry & Lawrence S. Cohen

[57] ABSTRACT

Apparatus and method for filling and sealing selected holes in a circuit board with epoxy resin or the like. The board is sandwiched in series between sealing sheets of a thermoplastic material and barrier sheets of a glass fiber or the like to form a laminate stack through which the holes are drilled at selected locations. The stack is disassembled and the board is plated to coat the linings of the drilled holes therein with conductive material, followed by reassembly of the stack together with an overlying resin-carrying sheet such as a glass fiber coated and/or impregnated with epoxy resin. The stack and the resin-carrying sheet are subjected to heat and pressure for causing the sealing sheets to adhere to the board and then for melting the epoxy resin and for forcing it to flow into the holes in the circuit board. After the epoxy resin is cured, the various sheets are stripped from the board leaving the epoxy resin within the holes.

60 Claims, 22 Drawing Figures

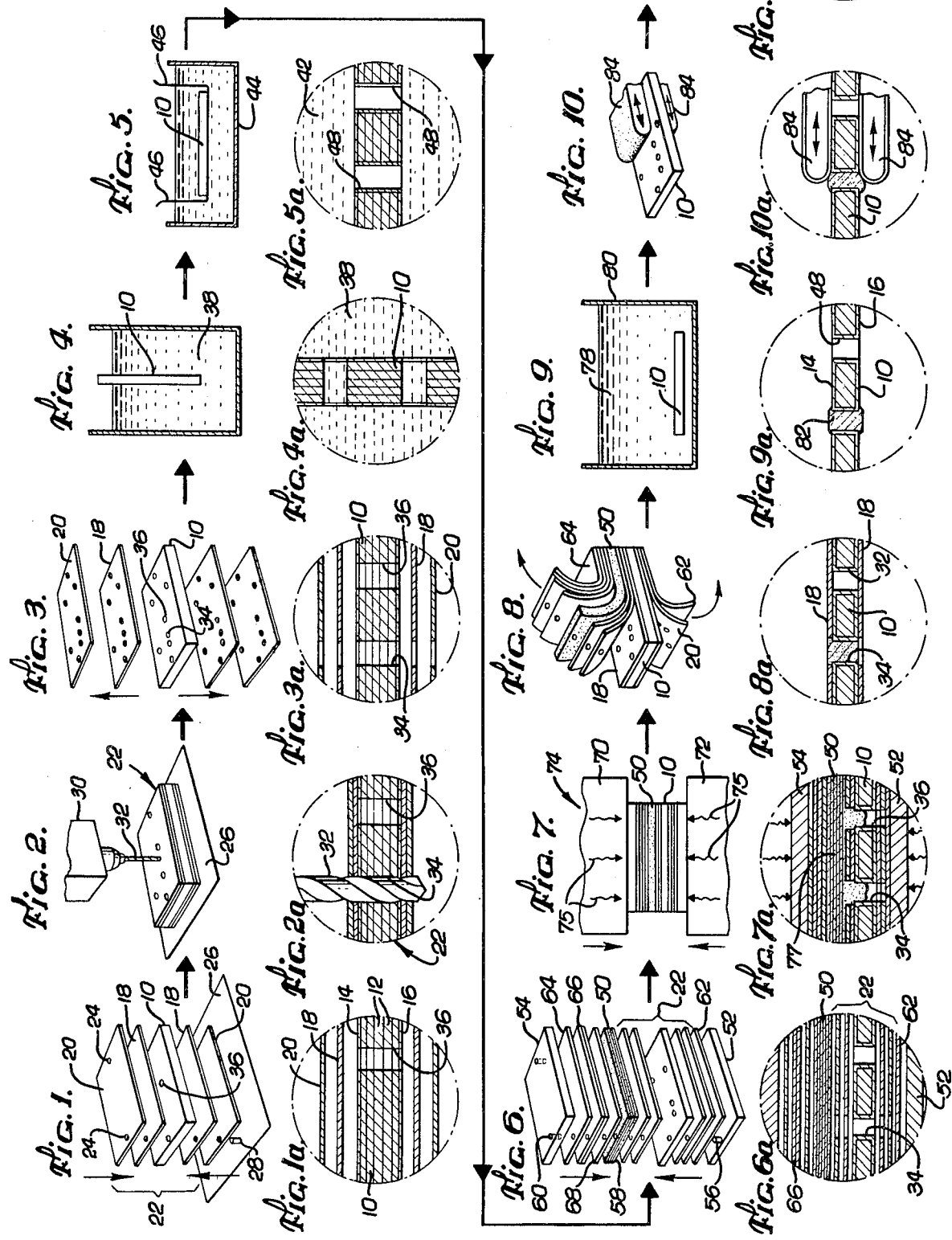

APPARATUS AND METHOD FOR FILLING HOLES IN A CIRCUIT BOARD

BACKGROUND OF THE INVENTION

This invention relates generally to improvements in the manufacture of circuit boards. More particularly, this invention relates to apparatus and method for use primarily with so-called multiple layer circuit boards wherein selected holes in the board may be filled and sealed quickly and easily with an epoxy resin or the like to prevent degradation of conductive material lining the holes by exposure to a corrosive atmosphere, moisture, or the like.

Circuit boards in general are known in the art and typically comprise a substrate formed from an insulating material such as a sheet of glass epoxy or the like having prescribed patterns of electrically conductive material, such as copper, imprinted on the opposite sides thereof. These conductive patterns can be electrically communicated with each other by one or more holes drilled through the board wherein these holes have their linings plated with additional electrically conductive material to complete the electrical path from one side of the board to the other. In addition, some of these holes define convenient mounting stations for receiving mounting prongs of electronic elements, such as transistors, resistors, capacitors, solid state chips, and the like, which operate in conjunction with the conductive patterns to define the desired electrical circuit.

According to modern circuit board production techniques, the circuit board sometimes includes a plurality of relatively thin glass epoxy substrate layers separated from each other by a plurality of specifically configured conductive patterns to form a so-called multilayer circuit board. In a circuit board of this type, a significant number of holes are formed through the board and lined with conductive material for providing the desired electrical path between the various conductive patterns. Many of these holes are not required for receiving mounting prongs of electronic elements and thus it is desirable to fill and/or seal these holes with an appropriate substance which will prevent the conductive material lining the holes from degrading or being attacked by corrosive substances. In addition, filling these holes can result in an improved overall structural strength for the board.

In the prior art, this filling and sealing process has been accomplished by spreading an epoxy resin or the like over an upper surface of the board and by forcing the resin with a squeegee or similar manual tool into the open holes in the board. This manual process, however, is inconsistent with modern circuit board production techniques desiring relatively high production rates. Moreover, the epoxy resin is spread over substantial surfaces areas of the board and into some of the holes where it is not desired. This resin must be removed after curing by extensive and time-consuming sanding of the board surface and by redrilling of the holes to be utilized as mounting stations for electronic elements.

The present invention overcomes the problems and disadvantages of the prior art by providing a novel apparatus and method for filling and sealing selected holes in a multilayer circuit board with a filling material, such as an epoxy resin, wherein the resin is prevented from contacting undesired portions of the board, and in a manner consistent with modern techniques for high production rates.

SUMMARY OF THE INVENTION

In accordance with the invention, an apparatus and method is provided for filling and sealing selected holes in a multilayer circuit board with a sealing material, such as an epoxy resin or the like. The epoxy resin is forced under pressure into the selected holes without contaminating the general surface area of the board or filling other holes in the board wherein the epoxy resin is not desired. The apparatus and method utilizes material and operating steps consistent with high volume and high quality production.

In accordance with a preferred form of the invention, a multilayer circuit board is sandwiched between a pair of sealing sheets of a thermoplastic material, and these layers are in turn sandwiched between a pair of barrier sheets of a fibrous material, such as woven glass fiber or the like. The laminate stack or subassembly is then subjected to a drilling process wherein holes of a desired size are drilled therethrough at selected locations.

Following the drilling step, the laminate stack is disassembled and the circuit board is plated with a conductive material, such as copper, to coat the linings of the holes in the board with the conductive material. According to one technique, this plating step comprises dipping the circuit board into a conductive wetting solution commonly referred to as an electroless copper solution and then electroplating the board within an electroplating bath containing copper ions. The linings of the drilled holes are thus coated with the conductive material to provide electrical communication to various ones of the printed conductive patterns within the board.

The laminate stack including the plated board is reassembled together with an overlying resin-carrying sheet, such as a multiple ply group of glass fiber sheets impregnated and/or coated with a selected epoxy resin. The laminate stack and resin-carrying sheet are then subjected in a press to heat and pressure which causes the sealing sheets to adhere to and mask the general surface area of the board and the holes in which epoxy resin is not desired. The epoxy resin then melts and begins to flow through the holes drilled in the barrier and sealing sheets and further into the selected holes in the circuit board to fill those holes with epoxy resin. Importantly, the barrier sheets prevent the resin-carrying sheet from bonding to the sealing sheets.

According to a preferred form of the invention, the laminate stack and resin-carrying sheet are aligned with each other between a pair of platens having registration means for maintaining the layers in the desired alignment with each other. The platens are placed into the press along with the laminate stack and the resin-carrying sheet where they are subjected to a temperature of about 350° F. and a pressure of about 50 psi for a time period of about 20 minutes.

If desired, a or more pressure distribution sheets, preferably sheets of polyvinyl chloride or the like, are interposed between the resin-carrying sheet and the upper platen. The force distribution sheets may in turn be sandwiched between release sheets of the temperature resistant plastic or the like to prevent sticking of the upper platen to the pressure distribution sheets or to the resin-carrying sheet. The force distribution sheets function to insure relatively uniform application of the pressure over the surface area of the resin-carrying sheets which in turn results in relatively uniform filling of the selected holes in the circuit board with epoxy resin.

The laminate stack and the resin-carrying sheet are removed from the press and the epoxy resin is cured as by additional heating. After curing, the resin-carrying sheet is easily stripped from the adjacent barrier sheet, and the two barrier sheets are easily stripped from their respective sealing sheets. The sealing sheets adhering to the board are quickly and easily removed therefrom by exposure to a caustic solution of sodium hydroxide or the like. If any portion of the cured epoxy resin projects from the surface plane of the circuit board, such portions are quickly and easily removed by relatively light sanding.

Other features and advantages of the present invention will become apparent from the following detailed description taken in conjunction with the accompanying drawings which illustrate, by way of example, the principles of the invention.

BRIEF DESCRIPTION OF THE DRAWINGS

The accompanying drawings illustrate the invention. In such drawings:

FIG. 1 is an exploded perspective view illustrating assembly of a circuit board in a sandwich arrangement into a laminate stack with a pair of sealing sheets and a pair of barrier sheets;

FIG. 1a is an enlarged vertical section of the laminate stack of FIG. 1;

FIG. 2 is a fragmented perspective view illustrating drilling of holes through the laminate stack including the circuit board;

FIG. 2a is an enlarged vertical section of FIG. 2 further illustrating the drilling step;

FIG. 3 is an exploded perspective view illustrating disassembly of the laminate stack following the drilling step;

FIG. 3a is an enlarged vertical section of FIG. 3 further illustrating the disassembly step;

FIG. 4 is a schematic view illustrating dipping the circuit board into an electrically conductive wetting solution;

FIG. 4a is an enlarged section further illustrating the dipping step of FIG. 4;

FIG. 5 is a schematic view illustrating plating of the linings of holes formed in the circuit board;

FIG. 5a is an enlarged section further illustrating the plating step of FIG. 5;

FIG. 6 is an exploded perspective view illustrating reassembly of the laminate stack together with additional layers including an overlying resin-carrying sheet;

FIG. 6a is an enlarged vertical section of FIG. 6 further illustrating the reassembly step;

FIG. 7 is a schematic view illustrating the application of heat and pressure to the laminate stack and the resin-carrying sheet;

FIG. 7a is an enlarged section further illustrating the pressing step of FIG. 7;

FIG. 8 is an exploded perspective view illustrating stripping of various layers from the circuit board;

FIG. 8a is an enlarged vertical section of the board with the layers stripped in the step of FIG. 8 removed therefrom;

FIG. 9 is a schematic view illustrating stripping of the sealing sheets from the circuit board;

FIG. 9a is an enlarged vertical section of the board with the sealing sheets stripped therefrom;

FIG. 10 is a perspective view illustrating a sanding process for removing any portions of epoxy resin projecting from the surface plane of the circuit board;

FIG. 10a is an enlarged vertical section of FIG. 10;

FIG. 11 is a perspective view illustrating the circuit board having selected holes therein filled with epoxy resin; and FIG. 11a is an enlarged vertical section of the board of FIG. 11.

DETAILED DESCRIPTION OF THE PREFERRED EMBODIMENT

As illustrated in the accompanying drawings, apparatus and method are provided for the selective filling of holes in a circuit board with a filling and sealing material such as an epoxy resin or the like. This material is supplied into selected holes drilled in the circuit board without substantial contact with the general surface area of the board or entry into non-selected holes and in a manner consistent with relatively high production techniques of circuit boards.

While the invention is applicable to circuit boards in general, it is particularly adapted for use with a so-called multilayer circuit board 10 which, as viewed in the enlarged sectional FIGS. 1a through 5a, is composed of several relatively thin substrate layers 12 of glass epoxy or the like. These substrate layers 12 are separated from each other in a known manner by electrically conductive patterns of a conductive material, such as copper foil or the like (not shown), wherein these patterns are individually formed as by photographic techniques to have selected geometries. The substrate layers 12 and the conductive patterns are assembled together into a laminated and structurally integrated stack to form the multilayer circuit board 10. According to typical production techniques, this circuit board 10 has a thin layer 14 of conductive material such as copper foil bonded to its upper surface and a thin layer 16 of material such as copper foil bonded to its lower surface. These conductive layers 14 and 16 are transformed into specifically geometried conductive patterns by subsequent processing which will be referred to herein.

The multilayer circuit board 10 is conventionally processed by drilling techniques to include a plurality of holes drilled through the board. In most multilayer circuit boards, the substantial majority of these drilled holes are for permitting electrical communication between two or more of the various conductive patterns between the substrate layers 12 or the conductive patterns to be formed from the surface conductive layers 14 and 16. Alternatively, some of the drilled holes define mounting stations for receiving mounting prongs of electronic elements, such as transistors, resistors, capacitors, solid state components, and the like, and for electrically connecting these electronic elements to one or more of the various conductive patterns. In either case, the holes drilled through the board have their linings plated with a relatively thin sleeve of an electrically conductive material to permit the desired electrical connections.

According to the invention, it is desirable to fill the drilled holes which do not define mounting stations for electronic elements in order to seal the holes from contact with undesirable materials, such as moisture, corrosive vapors, or the like. More specifically, the present invention provides apparatus and method for filling selected ones of the drilled holes with a sealing material without filling other designated holes and without contacting or contaminating the general surface areas of the board with the sealing material.

More particularly, with reference to FIGS. 1 and 1a, the multilayer circuit board 10 is prepared for a drilling process by sandwiching the board between a pair of sealing sheets 18 of a selected thermoplastic sheet material, such as sheets of an acrylic resin or the like. One preferred form of the sealing sheets comprises a glass fabric sheet impregnated with acrylic resin, such as that sold by E. I. duPont de Nemours Co., Inc. under the trade name PYRALUX WA/G. The resultant assembled layers are in turn sandwiched between a pair of barrier sheets 20 formed a material substantially impervious to flow of epoxy resin such as, for example, fibrous sheets of a glass fiber or the like, such as those sold by E.I. duPont de Nemours Co. Inc. under the name ARMALON. The board 10 together with the sealing sheets 18 and the barrier sheets 20 define a laminate stack 22 wherein all of the layers have a pair of registration holes 24 preformed therein for assembly and alignment of the layers onto a support plate 26 with appropriately positioned registration pins 28.

As illustrated in FIGS. 2 and 2a, the laminate stack 22 is moved underneath a drilliling head 30 which has a depending drill bit 32 for drilling a plurality of holes 34 through the several layers of the stack 22. This drilling head 30 may be manually or automatically controlled to descend at selected locations with respect to the stack 22 to drill a prescribed plurality of the holes 34 at precisely selected locations. Importantly, these holes 34 are formed through the circuit board 10 and the sandwiching sealing the barrier sheets 18 and 20.

One of the holes 34 is formed in the board 10 at each location wherein electrical communication is required between two or more of the conductive patterns in the board but wherein mounting of an electronic component is not required. Accordingly, the drilled holes 34 constitute the holes to be filled with the density-increasing material, as will be described. Additional holes 36 may be formed in the board at locations where reception of mounting prongs of an electronic element is required. These additional holes can be formed as by drilling prior to association of the board with the sealing and barrier sheets 18 and 20, as evidenced by the existing hole 36 shown in FIG. 1, in which case the holes 36 are masked by the sealing and barrier sheets 18 and 20 during drilling of the holes 34. Alternatively, if desired, the mounting station holes 36 can be formed by drilling after the sealing and barrier sheets are disassembled from the board 10 as illustrated in FIGS. 3 and 3a.

After the plurality of holes 34 are formed in the laminated stack 22, the stack is disassembled as viewed in FIGS. 3 and 3a to remove the sealing sheets 18 and the barrier sheets 20 from the circuit board 10. These sheets 18 and 20 are placed aside for subsequent use while the circuit board is subjected to a plating process, as viewed in FIGS. 4–4a and 5–5a.

More particularly, the board 10 is first dipped into an electrically conductive wetting solution 38 within a reservoir 40 to coat the board including the linings of the drilled holes 34 and any mounting station holes 36 with electrically conductive solution upon which conductive material can be electroplated. This wetting solution commonly comprises a copper solution typically referred to as an electroless copper solution. After wetting, the board is transferred into an electroplating bath 42 within a tank 44 wherein the board is electrically coupled by leads 46 to a cathode electrode. When the bath 42 is coupled to an anode electrode in a known manner, ions of an electrically conductive material, such as copper, migrate from the bath and plate upon the surfaces of the circuit board. In this manner, the linings of the holes 34 and 36 are plated with relatively thin sleeves 48 (FIG. 5a) of the conductive material.

Following the plating step, the circuit board 10 is reassembled in sandwich relation with the sealing sheets 18 and the barrier sheets 20 to re-form the laminate stack 22, as shown in FIGS. 6 and 6a. The reassembled laminate stack 22 is associated with an overlying resin-carrying sheet 50 which supports a quantity of epoxy resin or the like for filling the holes 34 in the board.

In a preferred form of the invention, the resin-carrying sheet 50 comprises a plurality of plies of relatively thin glass fiber backing impregnated and/or coated with a suitable epoxy resin which can be made to flow from the fiber backing when subjected to heat and pressure. Importantly, the melting temperature of the epoxy resin is chosen to be generally equal to or slightly higher than the temperature at which the sealing sheets 18 begin to melt and adhere to the circuit board. The particular number of plies of the fiber backing is dependent upon the quantity of epoxy resin required for complete filling of the drilled holes 34, whereby the number of plies can be adjusted depending upon the number and the size of the holes 34 to be filled.

The laminate stack 22 and the resin-carrying sheet 50 are interposed in aligned relation with each other between a lower platen 52 and an upper platen 54. More specifically, the lower platen 52 supports registration pins 56 for reception through the registration holes 24 in the stack and further reception through corresponding registration holes 58 in the sheet 50 and into pockets 60 in the upper platen 54. Accordingly, the platens 52 and 54 provide a convenient mounting base for reassembly of the laminate stack 22 with the drilled holes 34 in the board 10 and in the sheets 18 and 20 in close alignment with each other.

The laminate stack 22 and the resin-carrying sheet 50 are advantageously associated with additional layers of sheet material shown in FIGS. 6 and 6a. For example, according to one form of the invention, a release sheet 62 is desirably interposed between the lower barrier sheet 20 and the lower platen 52 to reduce and/or eliminate any sticking of the barrier sheet to the platens when the entire assembly is subjected to heat and pressure, as will be described. This release sheet 62 preferably comprises a vinyl-based sheet of plastic material, such as that sold by E. I. duPont de Nemours Co. Inc. under the name TEDLAR, although any other material can be used which will not adhere significantly to either the barrier sheet 20 or the lower platen 52 when subjected to heat and pressure. Alternatively, if desired, the lower platen 52 can be coated with a suitable nonstick surface coating.

An additional release sheet 64 is desirably positioned at the underside of the upper platen 54. This upper release sheet also preferably comprises a vinyl-based plastic sheet such as that sold under the name TEDLAR, and functions to prevent underlying layers from adhering to the upper platen 54 when subjected to heat and pressure. Alternatively, if desired, the upper release sheet 64 can be formed from other suitable materials or replaced by a suitable nonstick surface coating on the underside of the upper platen 54.

One or more pressure distribution sheets 66 can be advantageously interposed between the upper release sheet 64 and the resin-carrying sheet 50 to insure relatively uniform distribution of pressure between the resin-carrying sheet 50 and the circuit board 10 when the assembly is subjected to heat and pressure. These pressure distribution sheets 66 comprise, in a preferred embodiment, sheets of a relatively soft plastic material, such as polyvinyl chloride or the like, which are pressed against the resin-carrying sheet to transfer pressure thereto relatively uniformly regardless of any localized discontinuities in the thickness of the resin-carrying sheets. Conveniently, an additional release sheet 68 of the type described above with respect to the release sheets 62 and 64 is interposed between the resin-carrying sheet 50 and the pressure distribution sheets 66 to prevent significant sticking therebetween as a result of applied heat and pressure.

The assembly of layers including the circuit board 10 and the resin-carrying sheet 50 are positioned as shown in FIGS. 7 and 7a between upper and lower press plates 70 and 72 of a press 74 for subjecting the assembly to heat and pressure for a prescribed period of time. The press plates 70 and 72 are moved toward each other to engage the upper and lower platens 54 and 52 to apply pressure to the assembly. At the same time, heating elements, illustrated by arrows 75, carried by the pressure plates are energized to provide a controlled heat input to the assembly. In one operating example of the invention, the assembly as illustrated was subjected to a pressure of about 50 psi and a temperature of about 350° F. for a time period of about 20 minutes.

The applied heat and pressure first causes partial melting of the sealing sheets 18 such that the sealing sheets adhere to the upper and lower conductive layers 14 and 16 on the circuit board 10. The two sealing sheets 18 thereby mask the general surface area of the board from contact with the epoxy resin and further mask the mounting station holes 36 from filling with the epoxy resin. The only portions of the circuit board not masked by the sealing sheets 18 are the plated sleeves 48 lining the drilled holes 34 in the circuit board wherein those holes are in direct communication with the resin-carrying sheet 50 via the aligned drilled holes in the overlying sealing sheet 18 and barrier sheet 20.

The heat and pressure ultimately causes the epoxy resin in the resin-carrying sheet to melt for pressure-induced flow in the direction of arrows 77 downwardly through the drilled holes in the adjacent barrier sheet 20 and the sealing sheet 18 into the holes 34 in the circuit board 10. This resin flow is illustrated in detail in FIG. 7a which shows the resin passing downwardly into an exemplary hole 34 in the board. The provision of the drilled holes in the underlying sealing sheet 18 and barrier sheet 20 provides a relatively small volume into which air from within the circuit board holes 34 can escape to insure complete filling of the circuit board holes 34 with epoxy resin.

The epoxy resin is cured in suitable manner, such as by removing the assembly from the press 74 and placing it within a curing oven for a period of time at an elevated temperature sufficient for the epoxy resin to cure to a relatively hard state. After sufficient curing, the various layers of sheet material are stripped from the board 10 and the sealing sheets 18, as illustrated in FIGS. 8 and 8a. More particularly, the platens 52 and 54, together with the various release sheets 62, 64, and 68 and any pressure distribution sheets 66 are quickly and easily stripped individually or in groups from the laminate stack 22 and the resin-carrying sheet 50. The resin-carrying sheet 50 and the underlying barrier sheet 20 are then stripped easily from the adjacent sealing sheet 18, and the lower barrier sheet 20 is stripped from the lower sealing sheet 18. Importantly, the barrier sheets 20 do not adhere significantly to the sealing sheets 18 and serve to prevent the sealing sheets from contacting and adhering to any surface other than the circuit board. Any portions of the epoxy resin projecting from the exterior surface planes of the two sealing sheets 18 tend to fracture cleanly at the exterior surface planes of the sheets 18, as viewed in FIG. 8a.

The sealing sheets 18 are quickly and easily stripped from the surface board 10 by exposing them to a solvent solution. In a preferred form of the invention, this is accomplished by dipping the board 10 with the sealing sheets 18 thereon into a caustic solution 78 of sodium hydroxide or the like in a tank 80 as shown in FIG. 9. This dissolves the sealing sheets 18 to leave the circuit board 10 with the holes 34 filled with cured epoxy resin 82. The mounting station holes 36 are, of course, open, as shown in FIG. 9a, for quick and easy reception of mounting prongs of electronic components.

If any portion of the cured epoxy resin 82 projects from the exterior surface planes of the circuit board 10, such as by the thickness of the now-removed sealing sheets 18, these portions of the resin are quickly and easily removed as by relatively light sanding with a belt sander 84 or the like, as shown in FIGS. 10 and 10a. This leaves the circuit board 10 with the holes 34 filled with the epoxy resin 82 as shown in FIGS. 11 and 11a. This board can be further processed as needed for installation of appropriate electronic components and/or photographic printing processes for converting the conductive layers 14 and 16 into prescribed circuit patterns.

A variety of modifications and improvements to the invention described herein are believed to be apparent to one skilled in the art. Accordingly, no limitation on the invention is intended, except as set forth in the appended claims.

What is claimed is:

1. A method of filling selected holes in a circuit board with a sealing material, comprising the steps of:
    covering the circuit board with masking means including a sealing sheet and a barrier sheet having holes formed therein in alignment with the selected holes in the board to expose the selected holes in the board through the masking means, said covering step comprising covering the circuit board with the sealing sheet to prevent contact between the sealing material and undesired portions of the board, and then covering the sealing sheet with the barrier sheet to prevent significant contact between the sealing material and the sealing sheet;
    forcing the sealing material to flow through the holes in the masking means into the selected holes in the circuit board; and
    stripping the masking means from the circuit board.

2. The method of claim 1 wherein said forcing step comprises forcing a curable epoxy resin through the holes in the masking means.

3. The method of claim 2 wherein said forcing step comprises forcing the epoxy resin under heat and pressure through the holes in the masking means, and including the step of allowing the epoxy resin to cure within the selected holes in the circuit board prior to said stripping step.

4. The method of claim 1 wherein said forcing step comprises covering the masking means with a resin-carrying sheet including a supply of an epoxy resin, and subjecting the resin-carrying sheet, masking means, and board to heat and pressure to melt the epoxy resin and force it to flow through the holes in the masking means.

5. The method of claim 4 wherein said heat and pressure step comprises placing the resin-carrying sheet, masking means, and board between press plates of a heated press.

6. The method of claim 5 wherein said heat and pressure step further includes placing the resin-carrying sheet, masking means, and board between a pair of platens having means for maintaining the masking means and board in alignment with each other, and then placing the platens between the press plates of the heated press.

7. The method of claim 1 wherein said forcing step comprises covering the barrier sheet with a resin-carrying sheet including a supply of an epoxy resin, and subjecting the resin-carrying sheet, barrier sheet, sealing sheet, and board to heat and pressure to melt the epoxy resin and force it to flow through the holes in the barrier sheet and the sealing sheet.

8. The method of claim 7 wherein the sealing sheet comprises a thermoplastic sheet material chosen to melt at least partially for sealing adherence to the board at a temperature generally equal to or less than the melting temperature of the epoxy resin such that the sealing sheet adheres to the board prior to flow of the epoxy resin into the selected holes in the board.

9. The method of claim 1 wherein said covering step comprises covering the board with the masking means and forming the selected holes in the board and the aligned holes in the masking means simultaneously, removing the masking means from the board, plating the linings of the selected holes in the board with electrically conductive material, and re-covering the board with the masking means.

10. A method of filling selected holes in a circuit board with a sealing material, comprising the steps of:
covering the board with a sealing sheet having holes formed therein in alignment with the selected holes in the board;
covering the sealing sheet with a barrier sheet selected from a material which will not adhere significantly to the sealing sheet and which has holes formed therein in alignment with the holes formed in the sealing sheet;
forcing the sealing material to flow through the holes in the barrier sheet and further through the holes in the sealing sheet and into the selected holes in the board;
stripping the barrier sheet from the sealing sheet; and stripping the sealing sheet from the board.

11. The method of claim 10 wherein said forcing step comprises covering the barrier sheet with a resin-carrying sheet including a supply of an epoxy resin, and subjecting the resin-carrying sheet, barrier sheet, sealing sheet, and board to heat and pressure to melt the epoxy resin and flow through the holes in the barrier sheet and the sealing sheet.

12. The method of claim 11 wherein the sealing sheet comprises a thermoplastic sheet material chosen to melt at least partially for sealing adherence to the board at a temperature generally equal to or less than the melting temperature of the epoxy resin such that the sealing sheet adheres to the board prior to flow of the epoxy resin into the selected holes in the board.

13. A method of filling selected holes in a circuit board with an epoxy resin, comprising the steps of:
covering the board with a sealing sheet having holes formed therein in alignment with the selected holes in the board;
covering the sealing sheet with a barrier sheet selected from a material which will not adhere significantly to the sealing sheet and which has holes formed therein in alignment with the holes formed in the sealing sheet;
covering the barrier sheet with a resin-carrying sheet including a supply of the epoxy resin;
subjecting the board and the overlying sheets to heat and pressure to melt the epoxy resin and force it to flow through the holes in the barrier sheet and further through the holes in the sealing sheet into the selected holes in the board;
allowing the epoxy resin to cure within the selected holes in the board;
stripping the barrier sheet from the sealing sheet; and stripping the sealing sheet from the board.

14. The method of claim 13 wherein the sealing sheet comprises a thermoplastic sheet material chosen to melt at least partially for sealing adherence to the board at a temperature generally equal to or less than the melting temperature of the epoxy resin such that the sealing sheet adheres to the board prior to flow of the epoxy resin into the selected holes in the board.

15. The method of claim 14 wherein said step of stripping the sealing sheet from the board comprises exposing the board and the sealing sheet to a solvent solution for dissolving the sealing sheet from the surface of the board.

16. The method of claim 13 wherein said step of subjecting the board and the covering sheets to heat and pressure comprises placing the baard and the covering sheets into a heated press and pressing the covering sheets onto the board at a pressure of about 50 psi and at a temperature of about 350° F. for a period of time of about 20 minutes.

17. A method of filling selected holes in a circuit board with an epoxy resin, comprising the steps of:
covering the board with a sealing sheet selected from a material responsive to heat and pressure to adhere to the board;
covering the sealing sheet with a barrier sheet selected from a material which will not adhere significantly to the sealing sheet;
forming the selected holes in the board by passing a hole-forming tool through the barrier sheet and further through the sealing sheet and the board;
removing the sealing sheet and the barrier sheet from the board;
plating the linings of the selected holes in the board with electrically conductive material;
re-covering the board with the sealing sheet and re-covering the sealing sheet with the barrier sheet with the holes in the sealing and barrier sheets maintained in alignment with the selected holes in the board;
covering the barrier sheet with a resin-carrying sheet including a supply of the epoxy resin;
subjecting the board and the overlying sheets to heat and pressure to melt the epoxy resin and force it to flow through the holes in the barrier sheet and further through the holes in the sealing sheet into the selected holes in the board;

allowing the epoxy resin to cure within the selected holes in the board;

stripping the barrier sheet from the sealing sheet; and stripping the sealing sheet from the board.

18. The method of claim 18 wherein the sealing sheet comprises a thermoplastic sheet material chosen to melt at least partially for sealing adherence to the board at a temperature generally equal to or less than the melting temperature of the epoxy resin such that the sealing sheet adheres to the board prior to flow of the epoxy resin into the selected holes in the board.

19. The method of claim 17 wherein said plating step comprises dipping the board into an electrically conductive wetting solution and then electroplating the board in an electroplating bath.

20. The method of claim 17 wherein said step of subjecting the board and the overlying sheets to heat and pressure comprises placing the board and the overlying sheets between a pair of platens including means for maintaining the sheets in alignment with the board, and placing the platens with the board and sheets therebetween into a heated press.

21. The method of claim 20 including the step of interposing at least one pressure distribution sheet between said resin-carrying sheet and the adjacent platen to provide relatively uniform pressure distribution over the surface area of the resin-carrying sheet.

22. A method of filling selected holes in a circuit board with a sealing material, comprising the steps of:

sandwiching the circuit board between masking means including a pair of sealing sheets and a pair of barrier sheets having holes formed therein in alignment with the selected holes in the board, said sandwiching step comprising sandwiching the board between the pair of sealing sheets for adhering to the board and then sandwiching the board and sealing sheets between the pair of barrier sheets selected from a material which will not adhere significantly to the sealing sheets;

forcing the sealing material through the holes in the masking means at one side of the board into the selected holes in the board; and stripping the barrier sheets and the sealing sheets from the board.

23. The method of claim 22 wherein said forcing step comprises forcing a curable epoxy resin through the holes in the masking means.

24. The method of claim 23 wherein said forcing step comprises forcing the epoxy resin under heat and pressure through the holes in the masking means, and including the step of allowing the epoxy resin to cure within the selected holes in the circuit board prior to said stripping step.

25. The method of claim 22 wherein said forcing step comprises covering one of the barrier sheets with a resin-carrying sheet including a supply of an epoxy resin, and subjecting the resin-carrying sheet, barrier sheets, sealing sheets, and board to heat and pressure to melt the epoxy resin and force it to flow through the holes in the adjacent barrier sheet and further through the associated sealing sheet into the selected holes in the board.

26. The method of claim 26 wherein the sealing sheets comprise a thermoplastic sheet material chosen to melt at least partially for sealing adherence to the board at a temperature generally equal to or less than the melting temperature of the epoxy resin such that the sealing sheets adhere to the board prior to flow of the epoxy resin into the selected holes in the board.

27. A method of filling selected holes in a circuit board witn an epoxy resin, comprising the steps of:

sandwiching the board between a pair of sealing sheets having holes therein in alignment with the selected holes in the board and selected from a material for adhering to the board;

sandwiching the board and the sealing sheets between a pair of barrier sheets having holes therein in alignment with the selected holes in the board and selected from a material which will not adhere significantly to the sealing sheets;

covering at least one of the barrier sheets with a resin-carrying sheet including a supply of the epoxy resin;

subjecting the board and the associated sheets to heat and pressure to melt the epoxy resin and force it to flow through the holes in the adjacent barrier sheet and further through the holes in the associated sealing sheet into the selected holes in the board;

allowing the epoxy resin to cure within the selected holes in the board;

stripping the barrier sheets from the sealing sheets; and stripping the sealing sheets from the board.

28. The method of claim 27 wherein the sealing sheets comprise a thermoplastic sheet material chosen to melt at least partially for sealing adherence to the board at a temperature generally equal to or less than the melting temperature of the epoxy resin such that the sealing sheets adhere to the board prior to flow of the epoxy resin into the selected holes in the board.

29. The method of claim 28 wherein said step of stripping the sealing sheets from the board comprises exposing the board and the sealing sheets to a solvent solution for dissolving the sealing sheets from the surface of the board.

30. The method of claim 27 wherein the step of subjecting the board and the associated sheets to heat and pressure comprises placing the board and the covering sheets into a heated press and pressing the covering sheets onto the board at a pressure of about 50 psi and at a temperature of about 350° F. for a period of time of about 20 minutes.

31. A method of filling selected holes in a circuit board with an epoxy resin, comprising the steps of:

sandwiching the board between a pair of sealing sheets selected from a material responsive to heat and pressure to adhere to the board;

sandwiching the board and the sealing sheets between a pair of barrier sheets selected from a material which will not adhere significantly to the sealing sheets;

forming the selected holes in the board by passing a hole-forming tool through the barrier sheets, sealing sheets, and board;

removing the barrier sheets and sealing sheets from the board;

plating the linings of the selected holes in the board with an electrically conductive material;

replacing the board in sandwich relation between the sealing sheets, and replacing the board and the sealing sheets in sandwich relation between the barrier sheets;

covering at least one of the barrier sheets with a resin-carrying sheet including a supply of the epoxy resin;

subjecting the board and the associated sheets to heat and pressure to melt the epoxy resin and force it to flow through holes in the adjacent barrier sheet and further through the holes in the associated sealing sheet into the selected holes in the board;

allowing the epoxy resin to cure within the selected holes in the board;

stripping the barrier sheets from the sealing sheets; and stripping the sealing sheets from the board.

32. The method of claim 31 wherein the sealing sheets comprise a thermoplastic sheet material chosen to melt at least partially for sealing adherence to the board at a temperature generally equal to or less than the melting temperature of the epoxy resin such that the sealing sheets adhere to the board prior to flow of the epoxy resin into the selected holes in the board.

33. The method of claim 32 wherein said step of stripping the sealing sheets from the board comprises exposing the board and the sealing sheets to a solvent solution for dissolving the sealing sheets from the surface of the board.

34. The method of claim 31 wherein said plating step comprises dipping the board into an electrically conductive wetting solution and then electroplating the board in an electroplating bath.

35. The method of claim 31 wherein said step of subjecting the board and the associated sheets to heat and pressure comprises placing the board and the associated sheets between a pair of platens including means for maintaining the sheets in alignment with the board, and placing the platens with the board and sheets therebetween into a heated press.

36. The method of claim 35 including the step of interposing at least one pressure distribution sheet between said resin-carrying sheet and the adjacent platen to provide relatively uniform pressure distribution over the surface area of the resin-carrying sheet.

37. The method of claim 36 including the step of interposing a release sheet between the resin-carrying sheet and the pressure distribution sheet to prevent sticking therebetween.

38. The method of claim 35 including the step of sandwiching the board and the associated sheets between a pair of release sheets and then sandwiching the resultant stack between the platens, the release sheets being chosen from a material to prevent sticking of other sheets in the stack to the platens.

39. The method of claim 31 including the step of removing any portion of cured epoxy resin projecting from an exterior surface plane of the board subsequent to said step of stripping the sealing sheets from the board.

40. Apparatus for filling selected holes in a circuit board with a sealing material, comprising:

masking means for covering at least one side of the board, said masking means having holes formed therein in alignment with the selected holes in the board; and means for forcing the sealing material to flow through the holes in the masking means into the selected holes in the circuit board.

41. The apparatus of claim 40 including a resin-carrying sheet covering said masking means and including a supply of an epoxy resin, said forcing means comprising means for subjecting said resin-carrying sheet, masking means, and board to heat and pressure to melt the epoxy resin and force it to flow through the holes in the masking means and into the selected holes in the board.

42. The apparatus of claim 40 wherein said masking means comprises a sealing sheet covering the board and selected from a material for adhering to the board, and a barrier sheet covering the sealing sheet and selected from a material to prevent significant adhering to the sealing sheet.

43. The apparatus of claim 42 wherein said sealing sheet comprises a thermoplastic material and wherein said barrier sheet comprises a fibrous material.

44. The apparatus of claim 40 wherein said forcing means comprises a heated press.

45. Apparatus for filling selected holes in a circuit board with epoxy resin, comprising:

a sealing sheet for covering at least one side of the board and having holes formed therein in alignment with the selected holes in the board, said sealing sheet being selected from a material for adhering to the board in response to heat and pressure;

a barrier sheet for covering the sealing sheet and having holes formed therein in alignment with the selected holes in the board, said barrier sheet being selected from a material which will not adhere significantly to the sealing sheet;

a resin-carrying sheet including a supply of the epoxy resin for covering the barrier sheet; and means for subjecting the board and the associated sheets to heat and pressure to cause the sealing sheet to adhere to the board and to cause the epoxy resin to melt and flow through the holes in the barrier sheet and further through the holes in the sealing sheet into the selected holes in the board.

46. The apparatus of claim 45 wherein said sealing sheet comprises a thermoplastic material for adhering to the board prior to filling of the selected holes in the board with the epoxy resin.

47. The apparatus of claim 46 wherein said thermoplastic material comprises an acrylic resin.

48. The apparatus of claim 47 wherein said barrier sheet comprises a glass fiber sheet.

49. The apparatus of claim 45 wherein said resin-carrying sheet comprises a glass fiber sheet carrying the epoxy resin.

50. The apparatus of claim 45 including means for removing the sealing sheet from the board.

51. The apparatus of claim 50 wherein said removing means comprises a solvent solution for dissolving the sealing sheet from the board.

52. The apparatus of claim 45 including means for removing any portion of the epoxy resin projecting from an exterior surface plane of the board.

53. Apparatus for filling selected holes in a circuit board with epoxy resin, comprising:

a pair of sealing sheets for sandwiching the board, said sealing sheets being selected from a material for adhering to the board in response to heat and pressure and having holes formed therein in alignment with the selected holes in the board;

a pair of barrier sheets for sandwiching the board and said sealing sheets, said barrier sheets being selected from a material which will not adhere significantly to said sealing sheets and having holes formed therein in alignment with the selected holes in the board;

at least one resin-carrying sheet including a supply of the epoxy resin for covering at least one of the barrier sheets; and means for subjecting the board and the associated sheets to heat and pressure to cause said sealing sheets to adhere to the board and to cause the epoxy resin to melt and flow through the holes in the adjacent barrier sheet and further through the associated sealing sheet into the selected holes in the board.

54. The apparatus of claim 53 including means for forming the selected holes in the board and the holes in said barrier and sealing sheets after said barrier and sealing sheets are sandwiched about the board.

55. The apparatus of claim 53 including a pair of platens for receiving therebetween the board and the associated sheets, said platens including means for maintaining said associated sheets in alignment with the board.

56. The apparatus of claim 55 wherein said means for subjecting the board and associated sheets to heat and pressure comprises a heated press for receiving said platens and for applying heat and pressure thereto.

57. The apparatus of claim 56 including at least one pressure distribution sheet interposed between said resin-carrying sheet and the adjacent one of said platens for uniformly distributing pressure to said resin-carrying sheet.

58. The apparatus of claim 57 wherein said pressure distribution sheet is formed from polyvinyl chloride.

59. The apparatus of claim 57 including a release sheet interposed between said resin-carrying sheet and said pressure distribution sheet to prevent sticking therebetween.

60. The apparatus of claim 55 wherein the board and associated sheets are sandwiched between a pair of release sheets, said platens being sandwiched about said release sheets.

* * * * *